United States Patent
Haggenmiller et al.

(10) Patent No.: US 11,860,208 B2
(45) Date of Patent: Jan. 2, 2024

(54) DEVICE AND METHOD FOR TESTING THE FUNCTION OF AN ANTENNA SYSTEM FOR FOREIGN METAL DETECTION

(71) Applicant: Vitesco Technologies GmbH, Hannover (DE)

(72) Inventors: Christoph Haggenmiller, Munich (DE); Alexander Bueenfeld, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 312 days.

(21) Appl. No.: 17/424,038

(22) PCT Filed: Jan. 15, 2020

(86) PCT No.: PCT/EP2020/050894
§ 371 (c)(1),
(2) Date: Jul. 19, 2021

(87) PCT Pub. No.: WO2020/148324
PCT Pub. Date: Jul. 23, 2020

(65) Prior Publication Data
US 2022/0082600 A1   Mar. 17, 2022

(30) Foreign Application Priority Data
Jan. 17, 2019 (DE) .......................... 102019200603.5

(51) Int. Cl.
*G01R 29/08* (2006.01)
*G01R 31/72* (2020.01)
(Continued)

(52) U.S. Cl.
CPC ........ *G01R 29/0892* (2013.01); *B60L 53/124* (2019.02); *G01R 31/72* (2020.01);
(Continued)

(58) Field of Classification Search
CPC ..... G01R 29/0892; G01R 31/72; H04B 17/26
See application file for complete search history.

(56) References Cited

U.S. PATENT DOCUMENTS 6,437,577 B1    8/2002   Fritzmann et al.
8,463,220 B2    6/2013   Lindenbauer et al.
(Continued)

FOREIGN PATENT DOCUMENTS

CN    102273094 A    12/2011
CN    104360290 A    2/2015
(Continued)

*Primary Examiner* — Reena Aurora
(74) *Attorney, Agent, or Firm* — Laurence A. Greenberg; Werner H. Stemer; Ralph E. Locher (57) ABSTRACT

A device tests the function of an antenna system which includes antenna units each having an antenna and a resistor and is connected between an input of a selection unit and an output of a further selection unit. A computing unit provides a control signal for the two selection units at a first output. The control signal determines which input is connected to an output of the selection unit, and which of the outputs of a further selection unit is supplied with a bias voltage present at the input of the further selection unit, and to receive the antenna signal present at the output of the selection unit at an input of the computing unit. A diagnosis circuit is connected between the output of the selection unit and a diagnosis voltage terminal. The computing unit infers a fault in the antenna system from the comparison of antenna signals.

17 Claims, 5 Drawing Sheets

(51) Int. Cl.
*H04B 17/26* (2015.01)
*H02J 50/10* (2016.01)
*H02J 50/60* (2016.01)
*B60L 53/124* (2019.01)

(52) U.S. Cl.
CPC .............. *H02J 50/10* (2016.02); *H02J 50/60* (2016.02); *H04B 17/26* (2015.01)

(56) References Cited

U.S. PATENT DOCUMENTS

| | | | |
|---|---|---|---|
| 9,985,531 B2 * | 5/2018 | Haggenmiller | ... H02M 3/33507 |
| 10,038,508 B1 | 7/2018 | Kerselaers et al. | |
| 10,553,922 B2 | 2/2020 | So et al. | |
| 11,472,305 B2 * | 10/2022 | Pfeilschifter | ............. H02J 7/02 |
| 2015/0084640 A1 | 3/2015 | Quintin et al. | |

FOREIGN PATENT DOCUMENTS

| | | | |
|---|---|---|---|
| CN | 108028463 A | 5/2018 |
| DE | 19923729 A1 | 11/2000 |
| DE | 10334061 A1 | 3/2005 |
| DE | 102012200265 A1 | 7/2013 |
| DE | 102018206339 A1 | 10/2019 |
| EP | 1394558 A1 | 3/2004 |

* cited by examiner

| SEI \ Vsns | NoE | MUX a: stuck @0 | MUX a: stuck @3 | MUX b: stuck @3 | MUX e: stuck @2 | MUX f: stuck @1 |
|---|---|---|---|---|---|---|
| 0 | Va | Va | (Vaux) | Va | Va | (Vaux) |
| 1 | Va | (Vaux) | (Vaux) | Va | (Vb) | Va |
| 2 | Va | (Vaux) | (Vaux) | Va | Va | (Vaux) |
| 3 | Vb | (Vaux) | Vb | Vb | (Va) | (Vaux) |
| 4 | Va | Va | Va | (Vaux) | Va | (Vaux) |
| 5 | Va | Va | Va | (Vaux) | (Vb) | Va |
| 6 | Vb | Vb | Vb | (Vaux) | (Va) | (Vaux) |
| 7 | Va | Va | Va | Va | Va | (Vaux) |
| 8 | Va | Va | Va | Va | Va | (Vaux) |
| 9 | Vb | Vb | Vb | Va | Vb | Vb |
| 10 | Va | Va | Va | Va | Va | (Vaux) |
| 11 | Va | Va | Va | Va | Va | (Vaux) |
| 12 | Vb | Vb | Vb | Vb | (Va) | (Vaux) |
| 13 | Va | Va | Va | Va | (Vb) | Va |
| 14 | Va | Va | Va | Va | Va | (Vaux) |
| 15 | Va | Va | Va | Va | Va | (Vaux) |

DEVICE AND METHOD FOR TESTING THE FUNCTION OF AN ANTENNA SYSTEM FOR FOREIGN METAL DETECTION

BACKGROUND OF THE INVENTION

Field of the Invention

The invention relates to a device and a method for testing the function of an antenna system, which is used in particular for foreign metal detection.

Inductive charging involves energy being transmitted by means of the transformer principle over distances of between a few centimeters and approx. 20 cm. A large magnetic field can be produced between an external floor coil (so-called primary coil) and an on-vehicle underbody coil (so-called secondary coil), depending on distance, design and power. The worse the two coils are aligned, the greater the stray magnetic field (EMC) can become, the greater the magnetic exposure for people can become and/or the less power can be transferred to the vehicle's battery. In addition, the efficiency of the transmission system deteriorates.

The alternating magnetic field produced in the air gap during the energy transfer leads to a metallic body located in the air gap, such as a coin, a nail and the like, being heated owing to the high transmission power. The temperatures arising in the metallic body can become so high that the housing enclosing the external floor coil, which is usually made of a plastic, could be damaged. In addition, there is the risk that the hot metallic body could ignite combustible materials in the vicinity, such as e.g. paper, which means that there is the risk of a major fire resulting. On the other hand, if a person tries to remove the already heated metallic object from the external floor coil, there is the risk of burns.

Inductive motor vehicle charging systems therefore have the need for so-called foreign metal detection, which deactivates the external floor coil and/or outputs a warning when a metallic object is detected in the floor gap. Since such foreign metal detection can also have a defect, the sensor system used therefor must be regularly checked for its functionality.

SUMMARY OF THE INVENTION

It is the object of the invention to specify a device and a method for testing the function of an antenna system used for foreign metal detection in an inductive motor vehicle charging system that are simple, inexpensive and reliable. In particular, the aim is to allow a diagnosis for the measurement path and the receiving antennas before and during the operation of the inductive charging system.

These objects are achieved by means of a device according to the features of the independent device patent claim and a method according to the features of the independent method patent claim. Advantageous configurations emerge from the dependent patent claims.

According to a first aspect, a device for testing the function of an antenna system, in particular for foreign metal detection, is proposed. The device and the antenna system are, in particular, components of an inductive motor vehicle charging system. The device comprises an antenna system with a plurality of antenna units, wherein each of the antenna units comprising an antenna and at least one resistor is interconnected in each particular case between an assigned input of a selection unit and a specific one of multiple outputs of a further selection unit of the device. A computing unit of the device is designed to provide a control signal for the selection unit and the further selection unit, wherein the control signal defines which input of the selection unit is to be connected to an output of the selection unit and which of the outputs of the further selection unit is biased with a bias voltage applied to the input of the further selection unit. The computing unit of the device is also designed to receive the antenna signal present at the output of the selection unit at an input of the computing unit. The device further comprises a diagnostic circuit interconnected between the output of the selection unit and a diagnostic voltage connection and controllable by the computing unit, wherein a diagnostic voltage is applied to the diagnostic voltage connection. The computing unit is further designed to infer a fault in the antenna system from the comparison of antenna signals at the output of the selection unit that are determined when the diagnostic circuit is activated and not activated.

The underlying principle for the device according to the invention is based on the fact that a specific nominal voltage is obtained at the output of the selection unit for each antenna of the antenna system when the diagnostic circuit is not activated. Short circuits to ground, open connections, short circuits between two antennas and errors in the selection units can be determined by detecting a deviation from the specific nominal voltage. By comparing the voltage present at the output of the selection unit with and without the diagnostic circuit activated it is furthermore possible to automatically check the complete measurement path of the device.

The check on the functionality of the device can be used before and during the operation of the inductive charging device mentioned at the outset.

The device can be implemented in a simple and inexpensive manner. In particular, only a few additional components are necessary compared to conventional antenna systems for foreign metal detection. The functionality can be checked using the existing signal analysis structures. An evaluation of the functionality can be implemented by the computing unit in the form of software.

According to an expedient configuration, the diagnostic circuit comprises a series circuit comprising a switching element controllable by the computing unit and a diagnostic resistor. The diagnostic circuit can be used to change the voltage present at the output of the selection unit in a specific manner by activating the diagnostic circuit. On the basis of the known value of the diagnostic resistor, an expected deviation value of the signal at the output of the selection circuit is obtained—if the functionality of the antenna system is correct—that can then be evaluated in order to assess the functionality of the antenna system.

In particular, the controllable switching element can be switched on or off by a control signal for activating or deactivating the diagnostic circuit that is applied to a second output of the computing unit. As a result, the output of the selection circuit can be selectively connected to or decoupled from the diagnostic voltage connection at which the diagnostic voltage is present.

It is moreover useful if the selection unit has a number of multiplexers. In particular, the multiplexers can be interconnected in a cascading. Depending on the number of multiplexers, a corresponding number of antenna units is then obtained, a respective antenna unit being connected to an assigned input of one of the multiplexers.

The further selection unit expediently comprises a demultiplexer, the number of outputs of which corresponds to the number of multiplexers of the selection unit. A respective output of the further selection unit is connected via the antenna units to antenna-group-specific inputs (SEI0, . . . , SEI15) of the number of multiplexers, wherein one antenna-group-specific input is that input of each of the multiplexers of the selection unit that has the identifier that is present in the form of a binary number as the control signal. The provision of the further selection unit allows a diagnosis for the correct operation of the multiplexers of the selection unit and the correct operation of the demultiplexer of the further selection unit with regard to the incorrect selection of a channel owing to an internal error that is not visible in a line carrying the control signal. For this purpose, a respective specific number of antennas are combined into groups at their common base, these being selected via the demultiplexer of the further selection unit. By comparing measured values with an expected value, the correct control of all the multiplexers can be checked if a suitable group is selected.

In particular, each antenna unit comprises a first resistor interconnected in series between the antenna and that input of the selection unit that is assigned to the antenna unit. In connection with the diagnostic resistor, a voltage divider is obtained, the output of the selection unit representing the node between the diagnostic resistor and the first resistor of the (active) antenna unit currently under consideration. This allows different voltage potentials at the output of the selection unit, depending on whether or not the diagnostic circuit is activated.

Each antenna unit can also comprise a second resistor interconnected in parallel with the series circuit comprising the first resistor and the antenna of the relevant antenna unit. The provision of the second resistor means that no floating results when the antenna is separated from the node to which a bias voltage is applied. In particular, the second resistor also permits the functionality of the selection unit and the control thereof to be tested.

It is moreover useful if the first resistors of the antenna units coupled to the inputs of a multiplexer have at least two different resistance values. A suitable choice of which antenna is provided with which first resistor (so-called series resistor) allows the correct operation of the multiplexers to be checked even in the case of selection units that comprise a large number of multiplexers. The series resistors are chosen in such a way that each multiplexer coupled to an antenna unit delivers a different result at at least one input than the other inputs. This allows a control error to be clearly identified. The resistance values are also selected in such a way that a clear result pattern is provided.

For a complete test of the antenna system, the computing unit is expediently designed to connect each antenna unit to the output of the selection unit by means of a suitable control signal for the selection unit with the diagnostic circuit deactivated and to record all the determined signals in a first results table. The computing unit is further designed to connect each antenna unit to the output of the selection unit by means of a suitable control signal for the selection unit with the diagnostic circuit activated and to record all the determined signals in a second results table. A fault in the antenna system is then inferred from a comparison of the first and second results tables.

The location of a fault in the antenna system can further be inferred from the comparison of the first and second results tables. The fault locations distinguished can be the antenna assigned to an antenna unit, the antenna connection assigned to an antenna unit, the selection unit or the signal processing unit interconnected between the output of the selection unit and the input of the computing unit.

According to a second aspect, a method for testing the function of an antenna system, in particular for foreign metal detection, is proposed. The antenna system comprises a plurality of antenna units, wherein each of the antenna units comprising an antenna and at least one resistor is interconnected in each particular case between an assigned input of a selection unit and a specific one of multiple outputs of a further selection unit. The method involves a computing unit providing a control signal for the selection unit and the further selection unit at a first output, wherein the control signal defines which input of the selection unit is to be connected to an output of the selection unit and which of the outputs of the further selection unit is biased with a bias voltage applied to the input of the further selection unit, and receiving the antenna signal present at the output of the selection unit at an input of the computing unit. Furthermore, a diagnostic circuit is selectively controlled. A fault in the antenna system is then inferred from the comparison of antenna signals at the output of the selection unit that are determined when the diagnostic circuit is activated and not activated.

The invention has the same advantages as those described above in connection with the device according to the invention.

For a complete test of the antenna system, each antenna unit is expediently connected to the output of the selection unit by a suitable control signal for the selection unit with the diagnostic circuit deactivated, and all signals determined are recorded in a first results table. Furthermore, each antenna unit is connected to the output of the selection unit by means of a suitable control signal for the selection unit with the diagnostic circuit activated, and all the determined signals are recorded in a second results table. A fault in the antenna system is then inferred from a comparison of the first and second results tables.

According to a further expedient configuration, the location of a fault in the antenna system is inferred from the comparison of the first and second results tables. The fault can be narrowed down to the following locations: The antenna assigned to an antenna unit, the antenna connection assigned to an antenna unit, the selection unit or a signal processing unit interconnected between the output of the selection unit and the input of the computing unit.

The invention is described in greater detail below with reference to an exemplary embodiment in the drawing, in which:

DETAILED DESCRIPTION OF THE INVENTION

Figure 1:
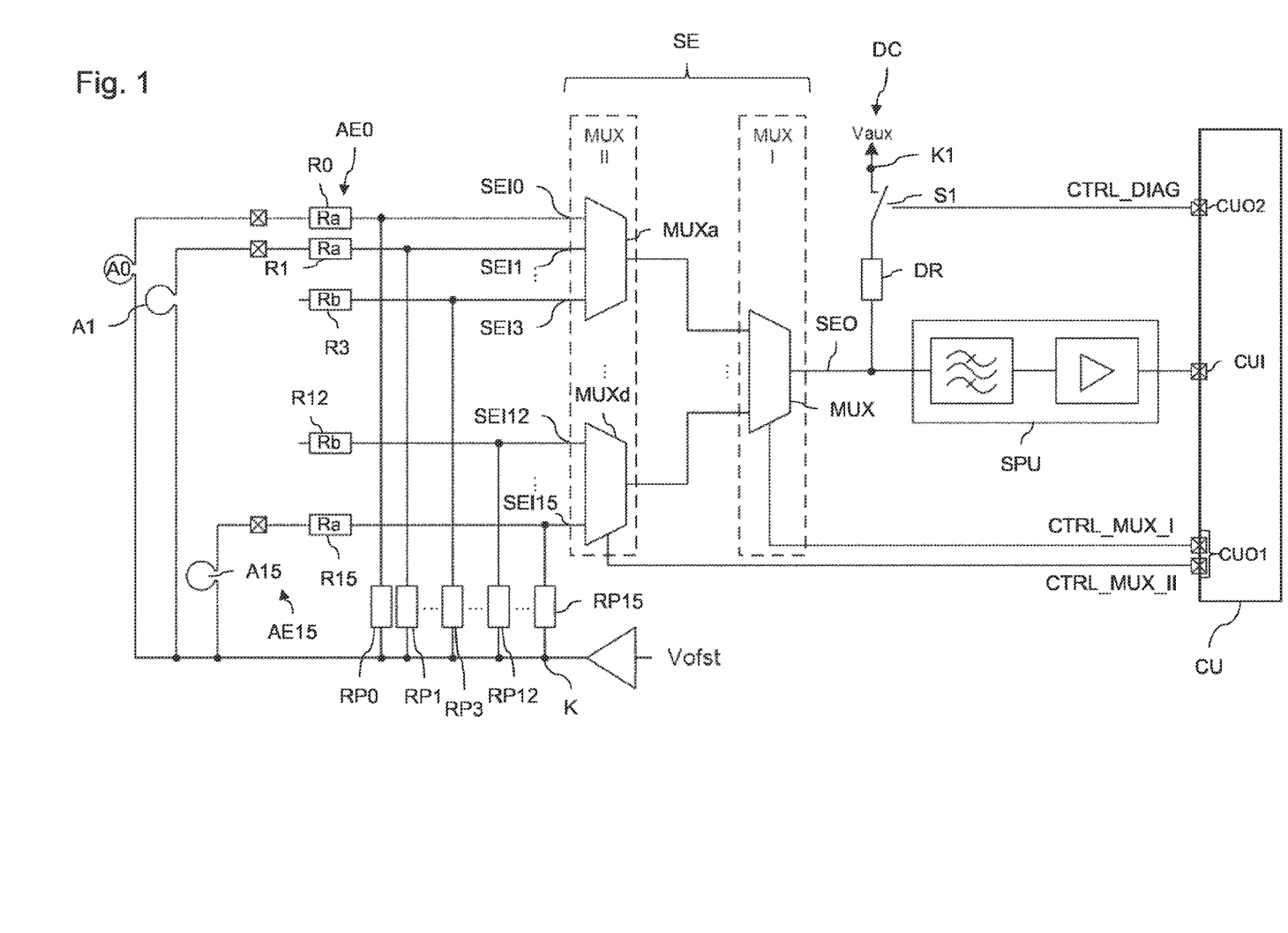
FIG. 1 shows a schematic depiction of an electrical equivalent circuit diagram for a device for testing the function of an antenna system for foreign metal detection.

FIG. 1 shows a schematic depiction of an electrical equivalent circuit diagram for a device according to the invention for testing the function of an antenna system. The antenna system is used for foreign metal detection, which reacts to the detection of a metallic object, for example a coin, a screw, a nail and the like, by outputting a warning and/or deactivating a technical system connected to the device. The device is used to be able to check defects in the antenna system and signal processing components connected to the antenna system for their functionality.

In particular, the device described below is intended for use in an inductive vehicle charging system that involves energy being transmitted by means of the transformer principle over distances of between a few centimeters and approx. 20 cm. Such an energy transmission system involves a large magnetic field being created between an external floor coil and an on-vehicle underbody coil, depending on distance, design and power. When the floor coil is active, a metallic body located in the effective area of the floor coil can be heated. The temperatures arising in the metallic body can become so high that the housing enclosing the external floor coil, which is typically made of a plastic, can be damaged. In addition, there is the risk that the hot metallic body can ignite combustible substances in the vicinity. There is also the risk of burns for living beings that come into contact with the already heated metallic object.

The device described below allows a test on the function of the antenna system and of the control and/or signal processing components connected downstream of the antenna system with regard to short circuits, open lines and the like. In the variant shown in FIG. 1, only the detection of internal errors in the selection unit used therein, in particular the incorrect selection of a channel owing to an internal error (so-called internal "stuck at" error), which is not visible on the control lines (Select lines) of the selection unit, is not possible with certainty.

The antenna system to be tested comprises a plurality of antenna units, in the example $AE0, \ldots, AE15$. Each of the antenna units $AE0, \ldots, AE15$ comprises an antenna $A0, \ldots, A15$, a first resistor $R0, \ldots, R15$ (so-called series resistor) interconnected in series with the antenna $A0, \ldots A15$, and a second resistor $RP0, \ldots, RP15$, which is merely optional and is interconnected in parallel with the series circuit comprising the first resistor $R0, \ldots R15$ and the antenna $A0, \ldots, A15$.

Each of the antenna units $AE0, \ldots, AE15$ is interconnected in each particular case between a node K biased with a bias voltage Vofst and an input, assigned to the respective antenna unit $AE0, \ldots, AE15$, of a selection unit SE. Depending on the voltage supply (not shown), the bias voltage can have a positive or a negative value (in the case of a unipolar voltage supply) or can be at a ground potential. The interconnection is such that a respective node comprising antenna $A0, \ldots, A15$ and parallel resistor $RP0, \ldots, RP15$ is interconnected with the node K and a node comprising the series resistor $R0, \ldots, R15$ and the parallel resistor $RP0, \ldots, RP15$ of a respective antenna unit is interconnected with a respectively uniquely assigned input $SEI0, \ldots, SEI15$ of the selection unit SE.

In the exemplary embodiment shown in FIG. 1, the selection unit SE consists of a cascade of multiplexers MUX, MUXa, $\ldots$, MUXd. The selection unit has two cascade stages MUX I and MUX II, merely by way of illustration. The cascade stage MUX II, which represents the input of the selection unit SE, has four multiplexers MUXa, $\ldots$, MUXd in the present exemplary embodiment, by way of illustration. The cascade stage MUX I, which represents the output of the selection unit SE, has the multiplexer MUX. The outputs of the multiplexers MUXa, $\ldots$, MUXd of the second cascade stage MUX II are accordingly connected to the inputs of the multiplexer MUX of the first cascade stage MUX I. An output of the multiplexer MUX represents an output SEO of the selection unit SE.

It goes without saying that the selection unit SE can be formed from a different number of cascade stages (one, three or more). The number of multiplexers from the second cascade stage MUX II onward can also be selected differently than here. As will also become clear from the description that follows, each multiplexer MUXa, $\ldots$, MUXd, MUX has four inputs and one output. It goes without saying that this is also merely illustrative.

The output SEO of the selection unit SE is connected to an input CUI of a computing unit CU via a signal processing unit SPU, which comprises, for example, a filter and an amplifier and the like. The computing unit CU is designed to provide a control signal for the selection unit SE at a first output CUO1, wherein the control signal defines which input $SEI0, \ldots, SEI15$ of the selection unit SE is to be connected to the output SEO of the selection unit SE. As a result, the computing unit can determine which antenna unit $AE0, \ldots, AE15$ is connected to the computing unit for evaluating an antenna signal.

The selection unit SE having multiple cascade stages means that two control signals CTRL_MUX_I and CTRL_MUX_II are required in the present case for controlling the multiplexer MUX of the first cascade stage MUX I and the multiplexers MUXa, $\ldots$, MUXd of the second cascade stage MUX II. In practice, this means that the computing unit CU comprises four first outputs or output terminals for this purpose, which in the present case are combined under the first output CUO1.

The computing unit CU is further designed to receive at its input CUI1 the antenna signal present at the output SEO of the selection unit SE and processed by the signal processing unit SPU.

The device further comprises a diagnostic circuit DC. The diagnostic circuit DC comprises a series circuit comprising a controllable switching element S1 and a diagnostic resistor DR. The series circuit comprising the controllable switching element S1 and the diagnostic resistor DR is interconnected between a diagnostic voltage connection K1 and the output SEO of the selection unit SE. The controllable switching element S1 is controlled using a control signal CTRL_DIAG, which is output at a second output CUO2 by the computing unit CU.

The control signal CTRL_DIAG that is output at the second output CUO2 of the computing unit CU can be used by the computing unit CU to determine whether the controllable switching element S1 is switched on or off. In the description that follows, when a controllable switching element S1 has been switched on, the diagnostic circuit DC is referred to as active or activated, and when a controllable switching element S1 has been switched off, the diagnostic circuit DC is referred to as inactive or deactivated.

The diagnostic resistor DR together with the series resistor $R0, \ldots, R15$ of the antenna unit $AE0, \ldots, AE15$ currently selected by the control unit CU form a voltage divider, the potential that is present at the output SEO of the selection unit SE resulting in a different voltage level depending on the activation or deactivation of the diagnostic circuit DC. From the comparison of the antenna signals at the output SEO of the selection unit SE that are determined when the diagnostic circuit DC is activated and not activated, the computing unit CU can infer a fault in the antenna system and the location of the occurrence of the fault.

Since the resistance values of the diagnostic resistor DR and the resistance values Ra, Rb of the series resistors R0, . . . , R15 of the antenna units AE0, . . . , AE15 are known, a voltage value that can be expected, both with the diagnostic circuit DC activated and with it deactivated, is obtained at the output SEO of the selection unit SE for each of the antenna units AE0, . . . , AE15 if they are operating as intended. If a fault occurs, be it due to an open connection of the antenna, a short circuit to ground or a short circuit between two antennas, a voltage value that deviates from the expected value is obtained at the output SEO of the selection unit SE for the antenna unit AE0, . . . , AE15 under consideration, on the other hand. This can be evaluated by the computing unit CU and, depending on the evaluation result, operation as intended or a fault and the location thereof can be inferred.

The basic principle of diagnosis is as follows:

A diagnosis for the antennas A0, . . . , A15 or for the connection between a respective antenna A0, . . . , A15 and the computing unit CU can be determined as a result of knowledge of the series resistance, which is known and defined for each antenna A0, . . . , A15, of magnitude Ra, Rb and the known magnitude of the diagnostic resistor DR. A specific nominal voltage is obtained for each of the antennas A0, . . . , A15. Short circuits to ground, open plug connections and short circuits between two antennas A0, . . . , A15 can be determined in this way. If the voltage measured at the output SEO is Vsns=Vref (which is obtained from the known magnitudes of the series resistor Ra, Rb and the magnitude of the diagnostic resistor DR), then there is no fault. A short circuit to ground results in Vsns being very much lower than Vref. The following applies in the case of an open line: Vsns>Vref. In the event of a short circuit to the adjacent antenna: Vsns<Vref. By comparing Vsns with and without the diagnostic circuit DC activated, the measurement path of the signal processing unit SPU is also automatically checked as well.

By evaluating the voltage value at the output SEO of the selection unit, the following faults can be inferred depending on the level of the voltage value: There is no fault if the voltage value is Va or Vb when the diagnostic circuit DC is activated. With an open line, a voltage value Vc is obtained. A short circuit to ground results in a voltage value Vd. In the event of a short circuit to an adjacent antenna, a voltage value Ve, Vf or Vg is obtained depending on whether the adjacent antenna has the same series resistance value Ra or Rb or a different series resistance value Ra or Rb. The voltage values Va, Vb, Vc, Vd, Ve, Vf and Vg are different voltage values that are obtained from the known magnitudes of the series resistor Ra, Rb and the magnitude of the diagnostic resistor DR and the fault that is currently occurring.

The diagnosis for the control of the multiplexers MUX, MUXa, . . . , MUXd is thus carried out, among other things, by using at least two series resistors Ra, Rb of different magnitude per multiplexer MUXa, . . . , MUXd. A suitable choice as to which of the antennas A0, . . . , A15 are provided with which series resistance value Ra or Rb allows all multiplexer controls to be checked for correct operation by means of the control signals CTRL_MUX_I, CTRL_MUX_II. A prerequisite for this is that each multiplexer MUXa, . . . , MUXd of the second cascade stage MUX II has a so-called "marker bit" MB (see FIGS. 4 and 5), i.e. each input of the multiplexer MUXa or MUXb or MUXc or MUXd currently under consideration must deliver a different result than the other inputs thereof. This allows control errors to be clearly identified. In addition, each multiplexer MUXa, . . . , MUXd of the second cascade MUX II must deliver a clear result pattern.

This procedure is explained below with reference to the selection unit SE depicted in enlarged form in FIG. 2 and the result matrices shown in FIGS. 3 to 5.

The diagnosis of the type described here can, if the antenna system is installed in an inductive charging system, be carried out before the start of the charging process or during the inductive charging process. In the latter case, it is expedient to briefly interrupt charging and carry out the diagnosis as described herein. Alternatively, the antennas A0, . . . , A15 can also be designed in such a way that the signal from the transmitting antenna is not completely compensated for to zero, as is the case with conventional metal detectors. In this way, a certain minimal signal can be measured by the computing unit during normal operation. If this signal disappears for one or more antennas, a fault can immediately be inferred.

Figure 2:
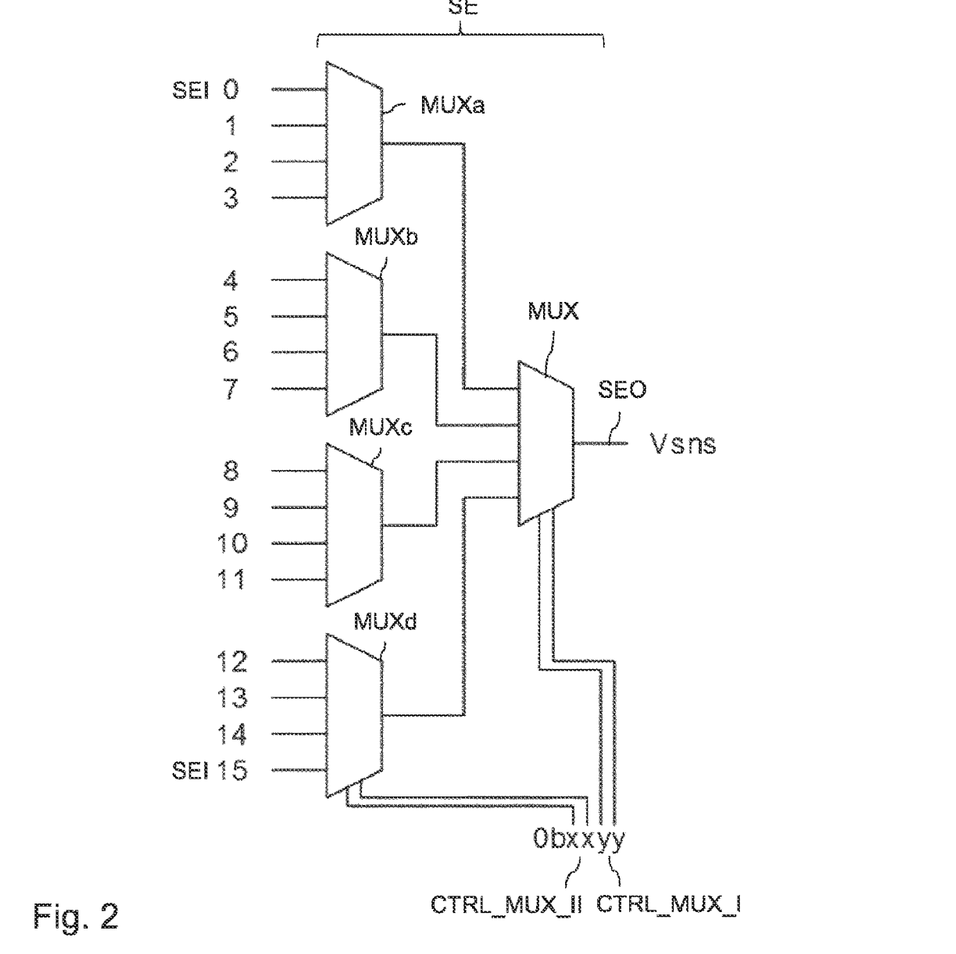
FIG. 2 shows an enlarged depiction of a selection unit of the device from FIG. 1.
Figure 3:
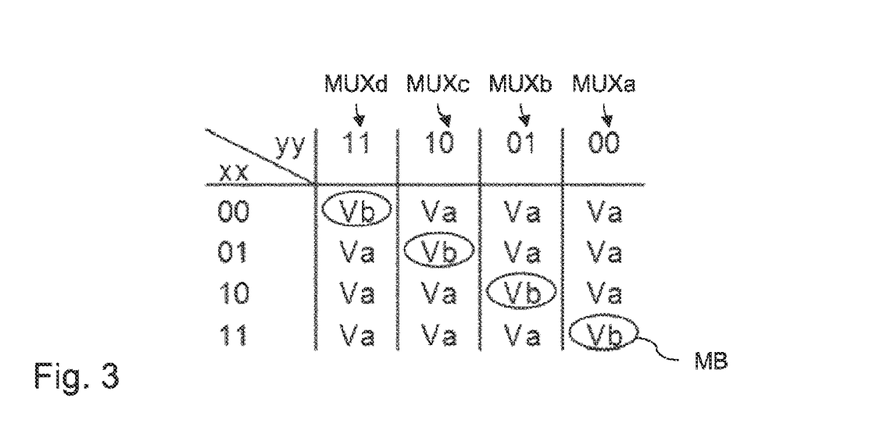
FIG. 3 shows a matrix depicting result values for the possible control situations of the selection unit from FIG. 2 when the antenna system does not have a functional fault.
Figure 4:
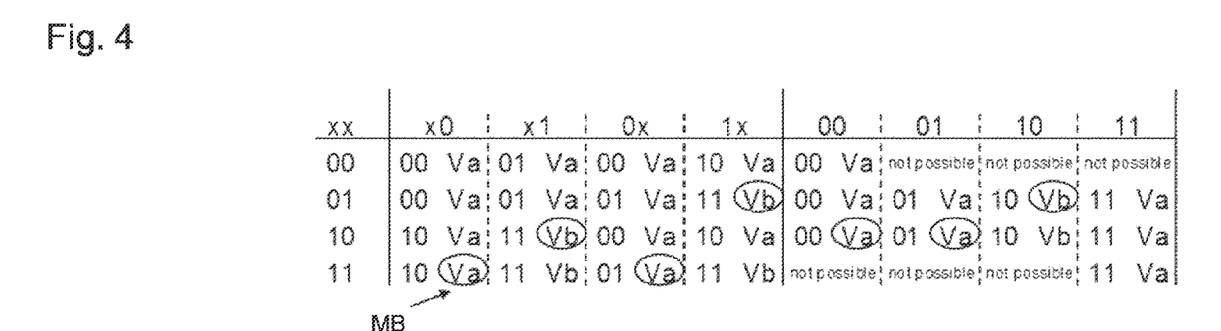
FIG. 4 shows a matrix depicting result states for a multiplexer of the selection unit from FIG. 2 when an error occurs.
Figure 5:
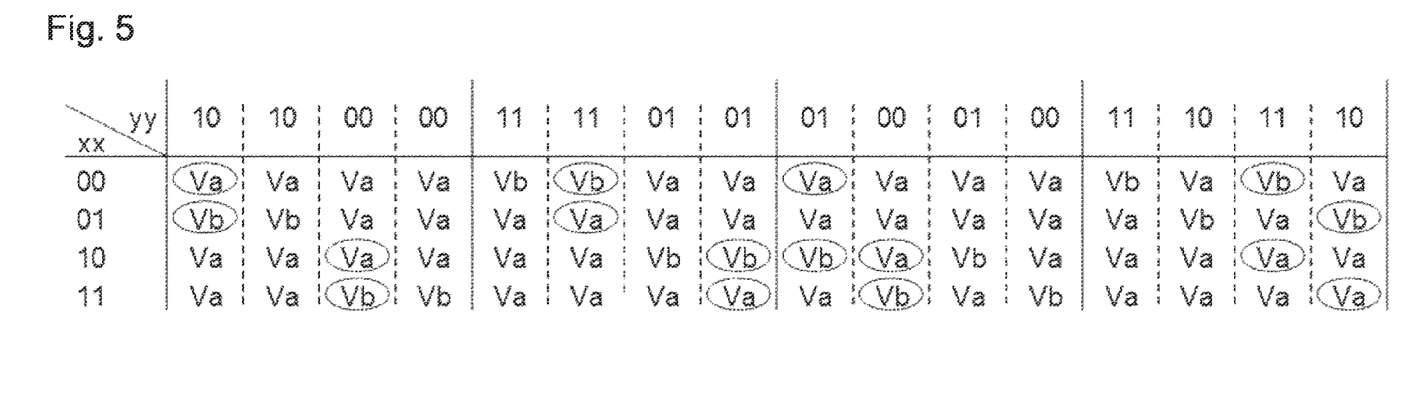
FIG. 5 shows an expanded error matrix when different error states occur on the selection unit.
Figure 6:
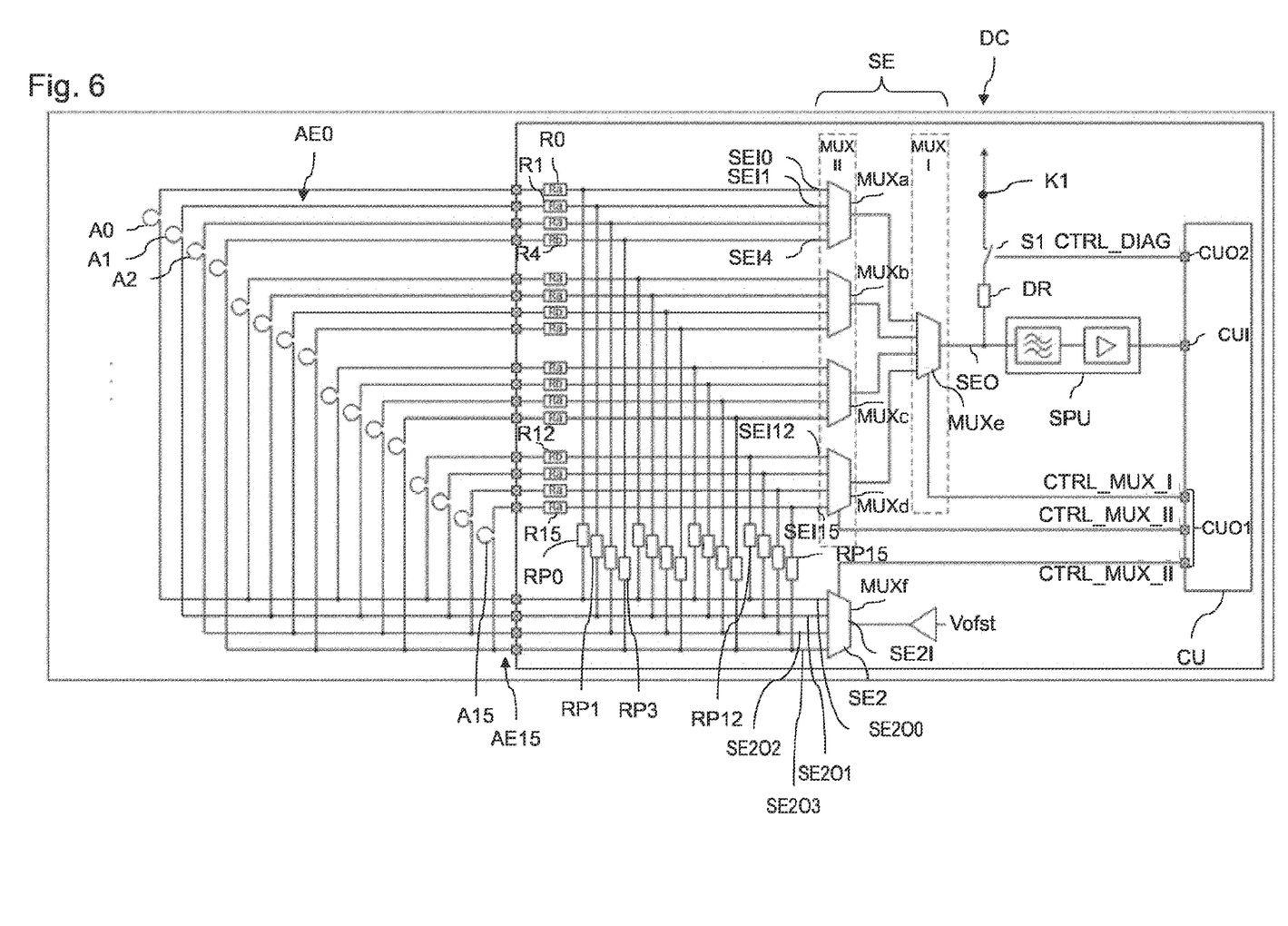
FIG. 6 shows a schematic depiction of an electrical equivalent circuit diagram according to the invention for a device for completely testing the function of an antenna system for foreign metal detection.

FIG. 2 shows an enlarged depiction of the selection unit SE from FIG. 1 to explain the control signals used in the matrices of FIGS. 3 to 5. The control signals CTRL_MUX_I and CTRL_MUX_II used by the computing unit CU to control the multiplexers MUX, MUXa, . . . , MUXd can be seen, the bit values for the control signal CTRL_MUX_I being indicated by yy and bit values for the control signal CTRL_MUX_II being indicated by xx. Furthermore, the inputs SEI0, . . . , SEI15 of the multiplexers MUXa, . . . , MUXd can be seen. It is readily apparent that the multiplexer MUXa comprises the inputs SEI0, . . . , SEI3, the multiplexer MUXb comprises the inputs SEI4, . . . , SEI7, the multiplexer MUXc comprises the inputs SEI8, SEI11 and the multiplexer MUXd comprises the inputs SEI12, . . . , SEI15.

FIG. 3 shows a matrix depicting the result values for the possible control situations of the selection unit SE. The possible signal values for yy for the control signal CTRL_MUX_I are indicated in columns and those for the values xx for the control signal CTRL_MUX_II are indicated in rows in the matrix. The matrix values Va and Vb denote the voltage values Vsns at the output SEO of the selection unit SEO. The voltage values Va and Vb are obtained depending on the resistance values Ra, Rb of the series resistors R0, . . . , R15 that are assigned to the respective input SEI0, . . . , SEI15. From this matrix it can be seen that the value of the series resistor R3 at the input SEI3 of the multiplexer MUXa has the value Rb, while the values of the series resistors of the other inputs SEI0, SEI1 and SEI2 of the multiplexer MUXa have the value Ra.

Similarly, the value of the series resistor R6 connected to the input SEI6 of the multiplexer MUXb is Rb, while the values of the other series resistors of the multiplexer MUXb are Ra. For the multiplexers MUXc and MUXd, the value of the series resistor R9 and the value of the series resistor R12, which are connected to the inputs SEI9 of the multiplexer MUXc and SEI12 of the multiplexer MUXd, are Rb, while all the other values of the series resistors are Ra. The positions at which the voltage value Vb is obtained on the basis of a different voltage value Vsns at the output SEO of the selection unit SE can be referred to as marker bit MB. The marker bits are denoted by an ellipse in the matrix shown in FIG. 3.

When a fault occurs and the diagnostic circuit is activated, deviating voltage values Vsns (namely Vc, Vd, Ve or Vg, see above) are obtained at the output SEO of the selection unit SE. A comparison of the result values of the matrix for a functional antenna system and an antenna system that has a fault allows a fault to be inferred.

FIG. 4 shows a further result matrix, which allows faults to be narrowed down when a control error occurs in the selection unit SE (first four columns in FIG. 4, so-called "stuck at" error) and when a short circuit occurs in the control lines for controlling the selection unit SE (last four columns, so-called "control lines shorted" error). FIG. 4 shows the results table when there is a control error in the line for the multiplexer MUXb of the second cascade stage MUX II.

By contrast, FIG. 5 shows an extended error matrix when there is an error in the control of the selection unit SE in relation to the high or low bit for the multiplexer MUX of the first cascade stage MUX II.

FIG. 5 shows a schematic depiction of an electrical equivalent circuit diagram according to the invention, which is an extension of the device shown and described in FIG. 1, and a detection of internal errors in the multiplexers, in particular the incorrect selection of a channel owing to an internal error that is not visible on the control lines CTRL_MUX_I, CTRL_MUX_II of the selection unit SE.

The device shown in FIG. 5 has a further selection unit SE2, comprising a demultiplexer MUXf. An input SE2I of the demultiplexer MUXf is biased with the bias voltage Vofst. The number of outputs SE2O0, . . . , SE2O3 corresponds to the number of multiplexers of the first cascade stage MUX II. In other words, the number of outputs SE2O0, . . . , SE2O3 is four. Each of the outputs SE2O0, . . . , SE2O3 is coupled in each particular case via the assigned resistor RP0, . . . , RP15 to exactly one input SEI0, . . . , SEI15 of the multiplexers of the first cascade stage MUX II, the relevant input being referred to as an antenna-group-specific input. The antenna-group-specific input is coupled to that input of each of the multiplexers MUXa, . . . , MUXd of the first cascade stage MUX II of the selection unit SE that has the identifier that is present in the form of an identical binary number as the control signal CTRL_MUX_II.

As a result, when the demultiplexer MUXf connects the input SE2I to the output SE2O0 (channel 0) on the basis of the control signal CTRL_MUX_II, the inputs SEI0 (channel 0) of the multiplexer MUXa, SEI4 (channel 0) of the multiplexer MUXb, SEI8 (channel 0) of the multiplexer MUXc and SEI12 (channel 0) of the multiplexer MUXd are connected to the bias voltage Vofst. The other inputs controlled by channels 1, 2 and 3, i.e. SEI1, SEI2, SEI3 of the multiplexer MUXa, SEI5, SEI6, SEI7 of the multiplexer MUXb, SEI9, SEWI10, SEI11 of the multiplexer MUXc and SEI13, SEI14, SEI15 of the multiplexer MUXd, are floating, on the other hand.

If the control signal CTRL_MUX_II controls channel 1 of the demultiplexer MUXf and the multiplexers MUXa, . . . , MUXd, the input SE2I is connected to the output SE2O1, as a result of which the inputs SEI1 of the multiplexer MUXa, SEI5 of the multiplexer MUXb, SEI9 of the multiplexer MUXc and SEI13 of the multiplexer MUXd are connected to the bias voltage Vofst. The other inputs controlled by channels 0, 2 and 3, i.e. SEI0, SEI2, SEI3 of the multiplexer MUXa, SEI4, SEI6, SEI7 of the multiplexer MUXb, SEI8, SEWI10, SEI11 of the multiplexer MUXc and SEI11, SEI14, SEI15 of the multiplexer MUXd, are floating, on the other hand.

The same applies if the control signal CTRL_MUX_II controls channel 2 or 3 of the demultiplexer MUXf and the multiplexers MUXa, . . . , MUXd.

The monitoring of "stuck at" errors in the selection units SE, SE2 can be effected by virtue of a respective specific number of antenna units, which are combined into groups at their common base, being selected via the demultiplexer. By comparing the position of the marker bits described above with the expected value, the correct control of all the multiplexers can be checked if a suitable group is selected.

Figure 7:
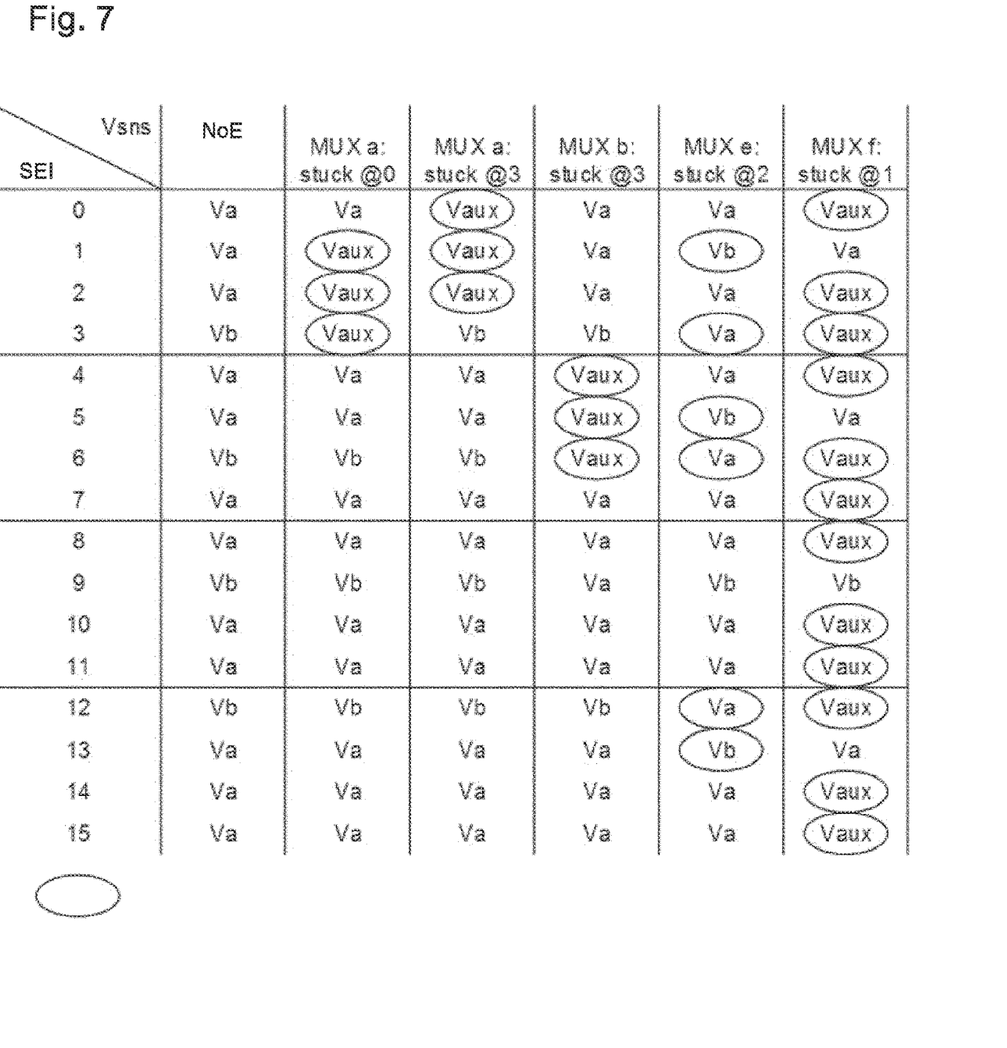
FIG. 7 shows a matrix depicting result states for a multiplexer of the selection unit from FIG. 6 when an error occurs.

FIG. 7 shows a result matrix that allows faults to be narrowed down when an internal error occurs in the selection unit SE (columns 2 to 4 "MUXa: stuck@0", "MUXa: stuck@3", "MUXb: stuck@13" and "MUXe: stuck@2") and when an internal error occurs in the further selection unit SE2 (last column "MUXf: stuck@1"). The column heading "MUXa: stuck@0" means that channel 0 remains statically "selected" in the multiplexer MUXa, even if the control signal CTRL_MUX_II selects a different channel (here: 1, 2 or 3). The column labeled "NoE" shows the expected values of the voltage Vsns=Va or Vsns=Vb expected at the output SEO for all inputs SEI0, . . . , SEI15 of the multiplexers if there is no error. An ellipse denotes deviations from the expected values in the respective error scenarios.

In the event of an error in which e.g. the multiplexer MUXa statically "selects" channel 0 (column 2 of the table), the selection of channels 1, 2 or 3 results in voltage values Vsns=Vaux (where Vaux>>than Va or Vb) at the output SEO for the inputs SEI1, SEI2 and SEI3, because the inputs SEI1 (when channel 1 is selected), SEI2 (when channel 2 is selected) and SEI3 (when channel 3 is selected) are floating owing to the connection to Vofst not being able to be made. The same applies to the other error cases shown in FIG. 7.

The invention claimed is:

1. A device for testing a function of a system, the device comprising:
   an antenna system containing a selection unit having inputs and an output, a further selection unit having a plurality of outputs and an input, and a plurality of antenna units, wherein each of said antenna units having an antenna and at least one resistor interconnected in each case between an assigned one of said inputs of said selection unit and a specific one of said plurality of outputs of said further selection unit;
   a computing unit having an input and outputs and configured to:
   provide a control signal for said selection unit and said further selection unit at a first output of said outputs of said computing unit, wherein the control signal defining which input of said inputs of said selection unit is to be connected to said output of said selection unit and which of said outputs of said further selection unit is biased with a bias voltage applied to said input of said further selection unit; and
   receive an antenna signal present at said output of said selection unit at said input of said computing unit;
   a diagnostic voltage connection;
   a diagnostic circuit interconnected between said output of said selection unit and said diagnostic voltage connection and controllable by said computing unit, wherein a diagnostic voltage is applied to said diagnostic voltage connection; and
   said computing unit being configured to infer a fault in said antenna system from a comparison of antenna signals at said output of said selection unit that are determined when said diagnostic circuit is activated and not activated.

2. The device according to claim 1, wherein said diagnostic circuit contains a series circuit having a switching element controllable by said computing unit and a diagnostic resistor.

3. The device according to claim 2, wherein said switching element can be switched on or off by a further control signal for activating or deactivating said diagnostic circuit that is applied to a second output of said outputs of said computing unit.

4. The device according to claim 1, wherein said selection unit contains a plurality of multiplexers each having inputs and an output.

5. The device according to claim 4, wherein said multiplexers are interconnected in a cascading configuration.

6. The device according to claim 4, wherein said further selection unit has a demultiplexer with a number of outputs, the number of said outputs of said demultiplexer corresponds to a number of said multiplexers of said selection unit.

7. The device according to claim 6, wherein a respective output of said outputs of said further selection unit is connected via said antenna units to antenna-group-specific inputs of said inputs of said plurality of multiplexers, wherein one antenna-group-specific input of said antenna-group-specific inputs is that input of each of said multiplexers of said selection unit that has an identifier that is present in a form of a binary number as the control signal.

8. The device according to claim 4, wherein each of said antenna units contains said at least one resistor being a first resistor interconnected in series between said antenna and one of said inputs of said selection unit that is assigned to a respective antenna unit of said antenna units.

9. The device according to claim 8, wherein each of said antenna units contains a second resistor interconnected in parallel with a series circuit containing said first resistor and said antenna.

10. The device according to claim 8, wherein said first resistors of said antenna units are coupled to said inputs of a multiplexer of said multiplexers and have at least two different resistance values.

11. The device according to claim 1, wherein said computing unit is configured, for a complete testing of the antenna system, said computing unit further configured to:
connect each of said antenna units to said output of said selection unit by means of the control signal for said selection unit with said diagnostic circuit deactivated and to record all determined signals in a first results table;
connect each of said antenna units to said output of said selection unit by means of the control signal for said selection unit with said diagnostic circuit activated and to record all further determined signals in a second results table; and
infer a fault in the antenna system from a comparison of the first and second results tables.

12. The device according to claim 11,
further comprising a signal processing unit;
wherein a location of the fault in the antenna system can be inferred from the comparison of the first and second results tables, the location of the fault being selected from the group consisting of:
said antenna assigned to said antenna unit;
an antenna connection assigned to said antenna unit;
said selection unit; and
said signal processing unit interconnected between said output of said selection unit and said input of said computing unit.

13. A method for testing a function of an antenna system, the antenna system containing a plurality of antenna units, wherein each of the antenna units having an antenna and at least one resistor interconnected in each case between an assigned input of a selection unit and a specific one of multiple outputs of a further selection unit, which comprises the steps of:
providing a computing unit programmed to:
provide a control signal for the selection unit and the further selection unit at a first output, wherein the control signal defines which input of the selection unit is to be connected to an output of the selection unit and which of the outputs of the further selection unit is biased with a bias voltage applied to an input of the further selection unit; and
receive an antenna signal present at the output of the selection unit at an input of the computing unit;
controlling a diagnostic circuit;
inferring a fault in the antenna system from a comparison of antenna signals at the output of the selection unit that are determined when the diagnostic circuit is activated and not activated.

14. The method according to claim 13, wherein for a complete testing of the antenna system,
each of the antenna units is connected to the output of the selection unit by means of a suitable control signal for the selection unit with the diagnostic circuit deactivated and all determined signals are recorded in a first results table;
each of the antenna units is connected to the output of the selection unit by means of a suitable control signal for the selection unit with the diagnostic circuit activated and all further determined signals are recorded in a second results table; and
the fault in the antenna system is inferred from a comparison of the first and second results tables.

15. The method according to claim 14, wherein a location of the fault in the antenna system is inferred from the comparison of the first and second results tables, the location of the fault being selected from the group consisting of:
the antenna assigned to an antenna unit;
an antenna connection assigned to the antenna unit;
the selection unit; and
a signal processing unit interconnected between the output of the selection unit and the input of the computing unit.

16. The method according to claim 13, which further comprises testing for a presence of a foreign metal.

17. An inductive charging system for an electrical vehicle containing an outer bottom coil or a vehicle-side underbody coil and a device for testing a function of antennas, wherein the antennas are provided for a detection of a foreign metal object located in an effective area of the coil, the device comprising:
an antenna system containing a selection unit having inputs and an output, a further selection unit having a plurality of outputs and an input, and a plurality of antenna units, wherein each of said antenna units having an antenna and at least one resistor interconnected in each case between an assigned one of said inputs of said selection unit and a specific one of said plurality of outputs of said further selection unit;
a computing unit having an input and outputs and configured to:

provide a control signal for said selection unit and said further selection unit at a first output of said outputs of said computing unit, wherein the control signal defining which input of said inputs of said selection unit is to be connected to said output of said selection unit and which of said outputs of said further selection unit is biased with a bias voltage applied to said input of said further selection unit; and receive an antenna signal present at said output of said selection unit at said input of said computing unit.

* * * * *